(12) United States Patent
Arai

(10) Patent No.: US 9,077,281 B2
(45) Date of Patent: Jul. 7, 2015

(54) OSCILLATOR CIRCUIT

(71) Applicant: NIHON DEMPA KOGYO CO., LTD., Tokyo (JP)

(72) Inventor: Junichi Arai, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 72 days.

(21) Appl. No.: 13/756,550

(22) Filed: Feb. 1, 2013

(65) Prior Publication Data
US 2013/0249641 A1    Sep. 26, 2013

(30) Foreign Application Priority Data

Mar. 23, 2012 (JP) .................... 2012-067333

(51) Int. Cl.
*H03B 5/12* (2006.01)
*H03B 5/36* (2006.01)

(52) U.S. Cl.
CPC ............ *H03B 5/1203* (2013.01); *H03B 5/1231* (2013.01); *H03B 5/362* (2013.01); *H03B 2200/0008* (2013.01); *H03B 2200/007* (2013.01)

(58) Field of Classification Search
CPC ............ G04F 5/06; H03B 5/08; H03B 5/12; H03B 5/1203; H03B 5/1228; H03B 5/1231; H03B 5/30; H03B 5/32; H03B 5/36; H03B 5/362; H03B 5/366; H03B 5/368; H03B 2200/0006; H03B 2200/0008; H03B 2200/007

USPC ............ 331/116 FE, 116 M, 116 R, 117 FE, 331/117 R, 154, 158, 167
See application file for complete search history.

(56) References Cited

U.S. PATENT DOCUMENTS

| | | | | |
|---|---|---|---|---|
| 3,832,653 A | * | 8/1974 | Nugent et al. | ............ 331/116 R |
| 4,859,969 A | * | 8/1989 | Malinowski et al. | ........... 331/43 |
| 6,949,983 B2 | * | 9/2005 | Satoh | ............. 331/158 |
| 7,262,670 B2 | * | 8/2007 | Rohde et al. | ............. 331/117 R |
| 7,586,381 B2 | * | 9/2009 | Rohde et al. | ..................... 331/96 |
| 2001/0043125 A1 | * | 11/2001 | Sato | ......................... 331/117 R |

FOREIGN PATENT DOCUMENTS

| | | |
|---|---|---|
| JP | 2004-266583 | 9/2004 |
| JP | 2004-289207 | 10/2004 |
| JP | 2006-345115 | 12/2006 |
| JP | 2007-020158 | 1/2007 |
| JP | 2010-041346 | 2/2010 |

* cited by examiner

*Primary Examiner* — Levi Gannon
(74) *Attorney, Agent, or Firm* — Jianq Chyun IP Office

(57) ABSTRACT

The oscillator circuit 10 comprises a crystal oscillator 20, a transistor 30, whose base is connected to the crystal oscillator 10, a first resonance circuit 40 that is between the emitter of the transistor 30 and the ground, the first resonance circuit 40 having a first inductor 42 and a first capacitor 44, a second resonance circuit 50 that is between the emitter and the ground, the second resonance circuit 50 having a second inductor 52 and a second capacitor 54, and a third capacitor 60 that is between the base and the emitter. The first resonance frequency of the first resonance circuit 40 is higher than the overtone frequency of the main oscillation of the crystal oscillator 20, and the second resonance frequency of the second resonance circuit 50 is lower than the overtone frequency of main oscillation of the crystal oscillator 20.

7 Claims, 9 Drawing Sheets

OSCILLATOR CIRCUIT

This application claims the priority benefit of Japan application serial no. 2012-067333, filed on Mar. 23, 2012. The entirety of the above-mentioned patent application is hereby incorporated by reference herein and made a part of this specification.

TECHNICAL FIELD

This disclosure relates to an oscillator circuit, especially to a technology for stably oscillating at overtone frequencies by eliminating unnecessary oscillations.

DESCRIPTION OF THE RELATED ART

An SC-cut crystal oscillator is used in instruments that require stable frequencies such as a measuring instrument or a communication instrument, because an SC-cut crystal oscillator is good at stabilizing frequencies. An SC-cut crystal oscillator has a C-mode that is a mode of a main oscillation (a thickness slip oscillation) and a B-mode (a thickness twist oscillation) that is a mode of a sub oscillation. Various circuits that are applications of a Colpitts circuit have been proposed as the circuits that make crystal oscillators stably oscillate in the C-mode without making the crystal oscillators oscillate in the B-mode (for example, referring to Japanese Unexamined Patent Application Publications No. 2004-266583, No. 2004-289207, No. 2006-345115, No. 2007-20158, and No. 2010-41346).

FIG. 5 shows an oscillator circuit 100 disclosed in Japanese Unexamined Patent Application Publications No. 2004-266583. The oscillator circuit 100 has a parallel resonance circuit 120 in series with a capacitor 110 between the emitter of the transistor and the ground. Since the parallel resonance circuit 120 resonates at a frequency where a crystal oscillator oscillates in the B-mode, which is the mode of the sub oscillation (hereinafter, a B-mode frequency), a negative resistance of the oscillator circuit 100 at the B-mode frequency has a positive value, and the oscillation at the B-mode frequency is prevented.

However, since the oscillation at the overtone frequency is not considered in the oscillator circuit 100, it has been impossible to prevent both the oscillation at the overtone frequency of the B-mode, which is the mode of the sub oscillation (hereinafter, a B-mode overtone frequency) and the oscillation at a frequency of a fundamental frequency (hereinafter, a fundamental frequency).

Since the inductor 122 and the capacitor 110 form a serial resonance circuit, there exists a second resonance frequency that is different from the resonance frequency of the parallel resonance circuit 120. However, when the inductor 122 serves both as the serial resonance circuit and the parallel resonance circuit, it is difficult to make the negative resistance of the oscillator circuit 100 (i) have a positive value at the B-mode overtone frequency and at the fundamental frequency, and (ii) have a negative value at the overtone frequency of the C-mode, which is the mode of the main oscillation (hereinafter, a C-mode overtone frequency). Thus, it is difficult for the oscillator circuit 100 to stably oscillate at the C-mode overtone frequency. Also, the oscillator circuit 100 has no amplification function.

FIG. 6 shows an oscillator circuit 200 disclosed in Japanese Unexamined Patent Application Publications No. 2004-289207. In the oscillator circuit 200, a serial resonance circuit 210 is between the emitter and the base of the transistor, and a parallel resonance circuit 220 is between the emitter of the transistor and the ground.

The oscillator circuit 200 has an inductive reactance at the sub oscillation frequency and the overtone frequency of the main oscillation, so that oscillations at those frequencies are prevented. Therefore, oscillating a crystal oscillator at the C-mode overtone frequency, while also preventing the crystal oscillator from oscillating at the fundamental frequency was not considered in the oscillator circuit 200.

Specifically, when a crystal oscillator is oscillated at the C-mode overtone frequency by using the oscillator circuit 200, the oscillator circuit 200 has a capacitive reactance at frequencies lower than the C-mode overtone frequency. Therefore, the oscillator circuit 200 has a possibility of oscillating at the fundamental frequency.

Further, in a Colpitts circuit, if the ratio of (i) the capacitance between the emitter and the base of the transistor and (ii) the capacitance between the emitter of the transistor and the ground changes, the gain of the transistor changes. Accordingly, there is a problem that the characteristics of the output signal of the oscillator circuit 200 tends to vary along with temperature changes, because the oscillator circuit 200 has inductor elements that tend to change characteristics along with temperature changes (i) between the emitter and the base of the transistor and (ii) between the emitter of the transistor and the ground.

FIG. 7 shows an oscillator circuit 300 disclosed in Japanese Unexamined Patent Application Publications No. 2006-345115. In the oscillator circuit 300, a serial resonance circuit 310 is on a feedback loop between the emitter and the base of the transistor. The oscillator circuit 300 has a negative resistance with a negative value at the frequency where a crystal oscillator oscillates in the C-mode, which is the mode of the main oscillation (hereinafter, a C-mode frequency), since the serial resonance circuit 310 has a resonance frequency that is the same as the C-mode frequency. Also, the oscillator circuit 300 has a negative resistance with a positive value at the B-mode frequency, since the trap circuit 320 that contains the serial resonance circuit which is between the emitter of the transistor and the ground has a resonance frequency that is the same as the B-mode frequency.

However, since the resonance frequency of the serial resonance circuit 310 fluctuates due to characteristic changes of the inductor or the capacitor caused by the temperature changes, the negative resistance at the C-mode frequency may become close to a positive value. Since the influence of the fluctuation of the resonance frequency becomes larger as the resonance frequency becomes higher, the configuration of the oscillator circuit 300 is not preferable for oscillating a crystal oscillator at a frequency higher than the fundamental frequency such as at the C-mode overtone frequency. Also, the oscillator circuit 300 has no amplification function.

FIG. 8 shows an oscillator circuit 400 disclosed in Japanese Unexamined

Patent Application Publications No. 2007-20158. In the oscillator circuit 400, a serial resonance circuit 410 and a parallel resonance circuit 420 are between the emitter of the transistor and the ground. Similar to the oscillator circuit 300 shown in FIG. 7, the oscillator circuit 400 has a negative resistance with a negative value at the C-mode frequency, since the serial resonance circuit 410 has the resonance frequency that is the same as the C-mode frequency. Also, the oscillator circuit 400 has a negative resistance with a positive value at the B-mode frequency because the parallel resonance circuit 420 that is between the emitter of the transistor and the ground has a resonance frequency that is the same as the B-mode frequency.

However, the resonance frequency of the serial resonance circuit 410 fluctuates due to characteristic changes of the inductor or the capacitor caused by the temperature changes. Thus, the configuration of the oscillator circuit 400 is not preferable for oscillating a crystal oscillator at a frequency higher than the fundamental frequency such as at the C-mode overtone frequency.

FIG. 9 shows an oscillator circuit 500 disclosed in Japanese Unexamined Patent Application Publications No. 2010-41346. In the oscillator circuit 500, the oscillator 500 has a negative resistance with a positive value at the B-mode frequency, since the resonance frequency of a serial resonance circuit 510 that is between the emitter of the transistor and the ground is the same as the oscillating frequency of the B-mode. As a result, the oscillator circuit 500 does not oscillate at the B-mode frequency.

However, the oscillator circuit 500 has a negative resistance with a negative value at a frequency lower than the C-mode frequency. Therefore, when the oscillator circuit 500 oscillates a crystal oscillator at the C-mode overtone frequency, the negative resistance of the oscillator circuit 500 is a negative value at the fundamental frequency, which is lower than the C-mode overtone frequency. As a result, a problem of oscillating at the fundamental frequency occurs in the oscillator circuit 500. Also, the oscillator circuit 500 has no amplification function.

SUMMARY

The present disclosure was created in view of the aforementioned circumstances, and is to provide an oscillator circuit that stably oscillates a crystal oscillator at the C-mode overtone frequency of the main oscillation, and prevents the crystal oscillator from oscillating at the B-mode overtone frequency of the sub oscillation and at the fundamental frequency.

According to one of the aspects of the present disclosure, the oscillator circuit comprises a crystal oscillator, a transistor, whose base is connected to the crystal oscillator, a first resonance circuit that is between the emitter of the transistor and the ground, the first resonance circuit having a first inductor and a first capacitor, a second resonance circuit that is between the emitter and the ground, the second resonance circuit having a second inductor and a second capacitor, and a third capacitor that is between the base and the emitter.

DESCRIPTION OF EXEMPLARY EMBODIMENTS

The First Embodiment
Explanation of the Basic Operation of an Oscillator Circuit 10

Figure 1:
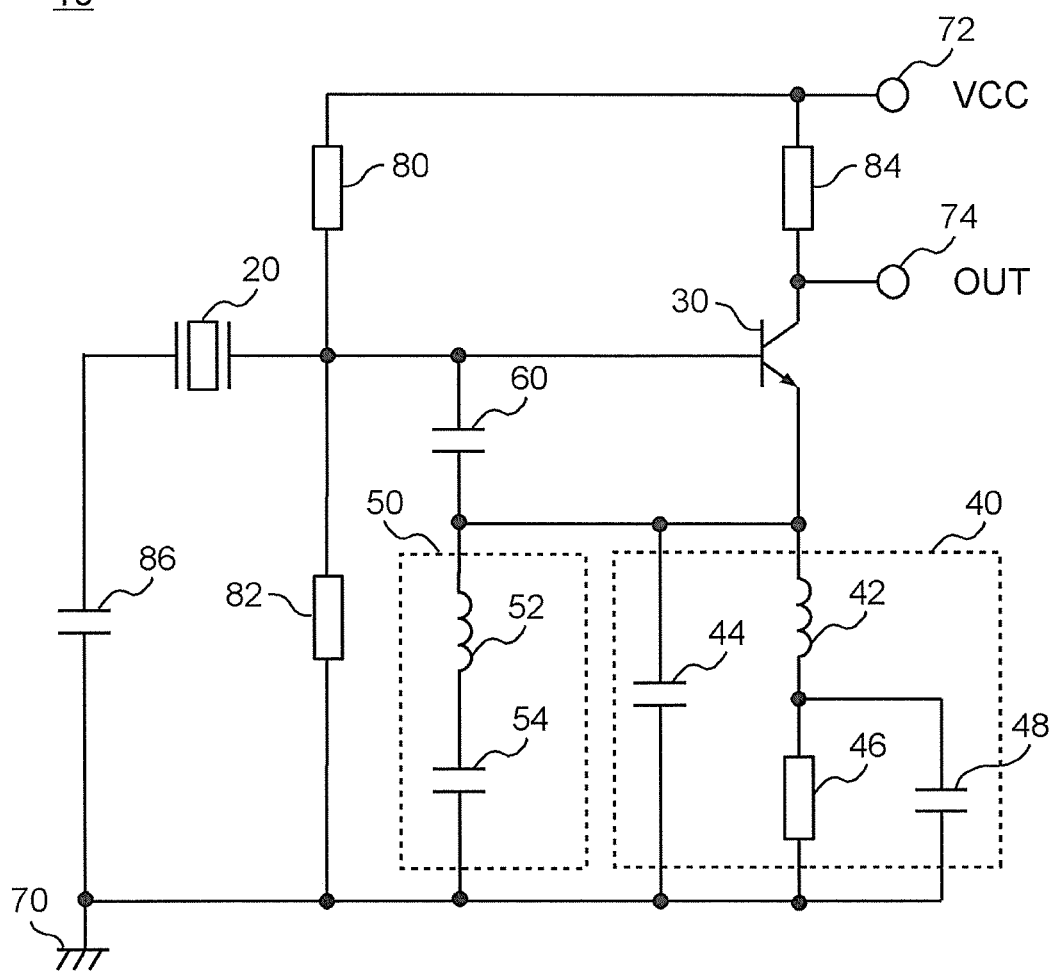
FIG. 1 shows a configuration of an oscillator circuit in the first embodiment.

FIG. 1 shows a configuration of an oscillator circuit 10 in the first embodiment. The oscillator circuit 10 comprises a crystal oscillator 20, a transistor 30, a first resonance circuit 40, a second resonance circuit 50, and a third capacitor 60. The crystal oscillator 20 is, for example, an SC-cut crystal oscillator, and has resonance points at a C-mode frequency and a B-mode frequency that is adjacent to the C-mode frequency. The crystal oscillator 20 also has resonance points at the overtone frequencies of the C-mode and the B-mode, in addition to the fundamental frequencies of the C-mode and the B-mode.

The oscillator circuit 10 has a negative resistance with a negative value at the overtone frequency of the C-mode, which is the mode of the main oscillation of the crystal oscillator 20. The negative resistance of the oscillator circuit 10 shows a positive value (i) at the fundamental frequencies of the main oscillation and the sub oscillation of the crystal oscillator 20 and (ii) at the overtone frequency of the sub oscillation of the crystal oscillator 20. Accordingly, the oscillator circuit 10 stably oscillates at the C-mode overtone frequency of the crystal oscillator 20, and does not oscillate at the fundamental frequencies or the B-mode overtone frequency.

For example, the oscillator circuit 10 stably oscillates at 30 MHz, which is the third overtone frequency of the crystal oscillator 20, the C-mode fundamental frequency of which is 10 MHz. The oscillator circuit 10 does not oscillate at the fundamental frequency of the C-mode, 10 MHz, at the fundamental frequency of the B-mode, 10.9 MHz, or at the B-mode overtone frequency, 32.7 MHz.

Hereinafter, the configuration of the oscillator circuit 10 is explained. The transistor 30 shown in FIG. 1 is an NPN bipolar transistor that amplifies the current inputted to its base. The oscillator circuit 10 may have an output terminal 74 that is connected to the collector of the transistor 30.

The collector of the transistor 30 is connected to the power supply terminal 72 through the resistor 84. The base of the transistor 30 is connected to the crystal oscillator 20, the third capacitor 60, the resistor 80, and the resistor 82. One end of the crystal oscillator 20 is connected to the base of the transistor 30, the third capacitor 60, the resistor 80, and the resistor 82, and the other end of the crystal oscillator 20 is connected to the ground 70 through the capacitor 86. The bias voltage of the transistor 30 is determined by the resistor 80 and the resistor 82. The third capacitor 60 functions as one of the voltage dividing capacitors in a Colpitts oscillator circuit.

The first resonance circuit 40 is between the emitter of the transistor 30 and the ground 70. The first resonance circuit 40 has the first inductor 42 and the first capacitor 44. For example, the first resonance circuit 40 is a parallel resonance circuit, and the first inductor 42 and the first capacitor 44 are connected in parallel between the emitter of the transistor 30 and the ground 70.

In FIG. 1, the first resonance circuit 40 further has the resistor 46 and the fourth capacitor 48. The resistor 46 and the fourth capacitor 48 are between the emitter of the transistor 30 and the ground 70. The resistor 46 stabilizes the amplification degree when the transistor 30 functions as a common emitter amplifier circuit.

The capacitance of the fourth capacitor 48 is larger than that of the first capacitor 44. When the capacitance of the fourth capacitor 48 is larger than that of the first capacitor 44 and the impedance at the C-mode overtone frequency is almost zero, the signal of this frequency goes to the fourth capacitor 48 while bypassing the resistor 46. As a result, the oscillator circuit and the amplifier circuit can be downsized, since the amplification degree of the oscillator circuit 10 at the C-mode overtone frequency is so large that no amplifier circuit is required on the downstream side of the oscillator circuit 10.

The first inductor 42 is connected to the emitter of the transistor 30, the first capacitor 44, the resistor 46, and the fourth capacitor 48. That is, the first inductor 42 is in series with the resistor 46 and the fourth capacitor 48 between the emitter of the transistor 30 and the ground 70. Because the first inductor 42 is between (i) the emitter of the transistor 30 and (ii) the resistor 46 and the fourth capacitor 48, the amplification degree of the signal at the C-mode overtone frequency is determined based on the value of the first inductor 42.

The resonance frequency of the first resonance circuit 40 is higher than the overtone frequency of the C-mode, which is the mode of the main oscillation of the crystal oscillator 20. For example, the first resonance frequency of the first resonance circuit 40 is the same as the overtone frequency of the B-mode, which is the mode of the sub oscillation of the crystal oscillator 20. The first resonance frequency of the first resonance circuit 40 may preferably be larger than the B-mode overtone frequency.

When the first resonance frequency of the first resonance circuit 40 is higher than the C-mode overtone frequency, the oscillator circuit 10 can have a negative resistance with a negative value at the C-mode overtone frequency, and a negative resistance with a positive value at the B-mode overtone frequency that is higher than the C-mode overtone frequency. As a result, the oscillator circuit 10 can stably oscillate the crystal oscillator 20 at the C-mode overtone frequency, and can prevent the crystal oscillator 20 from oscillating at the B-mode overtone frequency.

The first resonance frequency of the first resonance circuit 40 may preferably be larger than the B-mode overtone frequency, since the oscillator circuit 10 has a negative resistance with a positive value at the B-mode overtone frequency, and has a negative resistance with a negative value that is large enough at the C-mode overtone frequency.

The second resonance circuit 50 is between the emitter of the transistor 30 and the ground 70. The second resonance circuit 50 has a second inductor 52 and a second capacitor 54. For example, the second resonance circuit 50 is a serial resonance circuit, and the second inductor 52 and the second capacitor 54 are connected in series between the emitter of the transistor 30 and the ground 70. The second resonance circuit 50 may be a parallel resonance circuit.

The resonance frequency of the second resonance circuit 50 is lower than the overtone frequency of the main oscillation of the crystal oscillator 20. For example, the resonance frequency of the second resonance circuit 50 is the same as the fundamental frequency of the main oscillation or the fundamental frequency of the sub oscillation of the crystal oscillator 20. The resonance frequency of the second resonance frequency 50 may be a frequency between the fundamental frequency of the main oscillation of the crystal oscillator 20 and the third overtone frequency of the main oscillation of the crystal oscillator 20.

The oscillator circuit 10 has a negative resistance with a positive value at a resonance frequency of the second resonance circuit 50. Accordingly, when the resonance frequency of the second resonance circuit 50 is lower than the overtone frequency of the main oscillation of the crystal oscillator 20, the oscillator circuit 10 can have a negative resistance with a negative value at the C-mode overtone frequency, and can have a negative resistance with a positive value at the fundamental frequency. As a result, the oscillator circuit 10 can stably oscillate the crystal oscillator 20 at the C-mode overtone frequency, and can prevent the crystal oscillator 20 from oscillating at the fundamental frequency.

Frequency Characteristics of the Negative Resistance of the Oscillator Circuit 10

Figure 2:
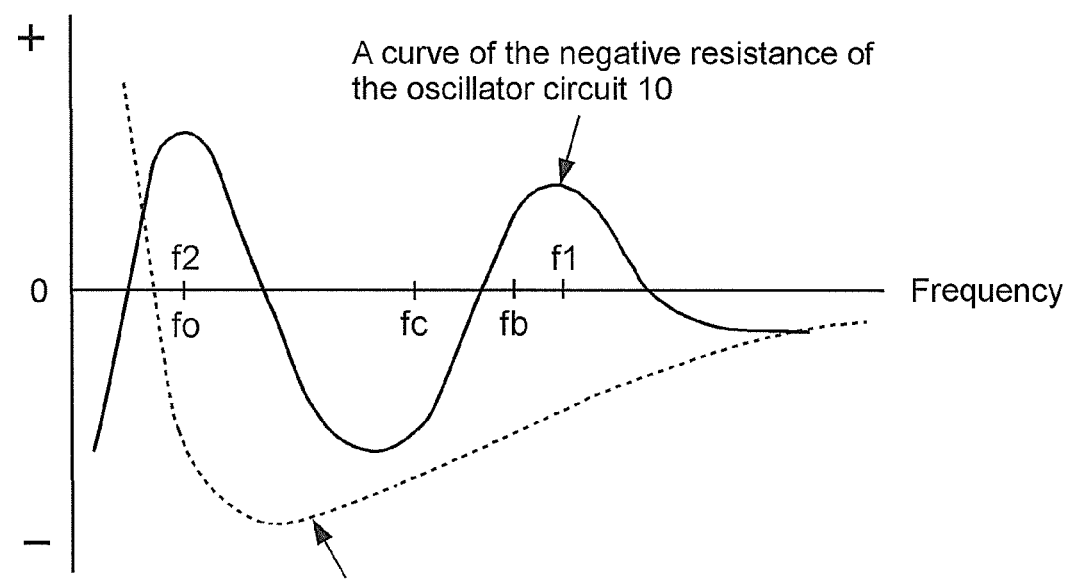
FIG. 2 shows a diagram of the frequency characteristics of a negative resistance of the oscillator circuit in the first embodiment.

FIG. 2 shows a diagram of the frequency characteristics of the negative resistance that the oscillator circuit 10 has. In FIG. 2, the solid line shows the negative resistance of the oscillator circuit 10, and the dashed line shows the negative resistance of the conventional Colpitts oscillator circuit that has a capacitor instead of the first resonance circuit 40 and the second resonance circuit 50.

In FIG. 2, the horizontal axis shows a frequency, fo on the frequency axis shows the fundamental frequency of the C-mode, fc shows the C-mode overtone frequency, fb shows the B-mode overtone frequency, f1 shows the resonance frequency of the first resonance circuit 40, and f2 shows the resonance frequency of the second resonance circuit 50. FIG. 2 shows a case in which fo is the same as f2, as an example. FIG. 2 does not show actual values of each frequency.

The negative resistance of the conventional Colpitts oscillator circuit that is shown as the dashed line shows negative values at each of the frequencies fo, fc, and fb. Accordingly, the crystal oscillator 20 has a possibility of oscillating at the fundamental frequency and at the B-mode overtone frequency. On the other hand, the negative resistance of the oscillator circuit 10 shown as the solid line shows a negative value at the C-mode overtone frequency fc, and shows positive values at the fundamental frequency fo and at the B-mode overtone frequency. Therefore, the oscillator circuit 10 stably oscillates at the C-mode overtone frequency.

Figure 3:
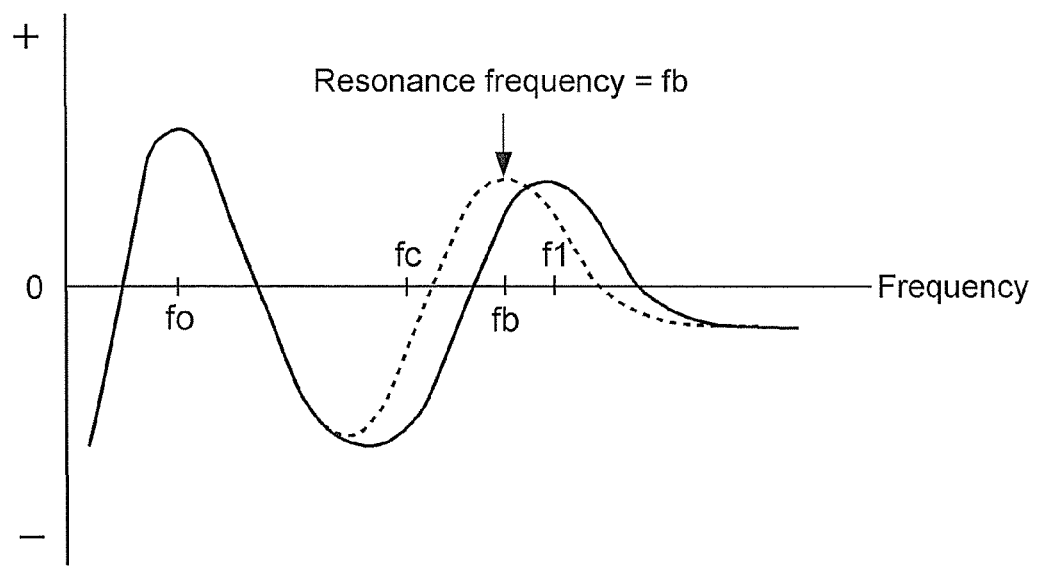
FIG. 3 shows a diagram of a negative resistance in the case when the resonance frequency of the first resonance circuit is the same as the B-mode overtone frequency.

FIG. 3 shows a diagram of a negative resistance (the dashed line) in the case where the resonance frequency of the first resonance circuit 40 is the same as the B-mode overtone frequency. As is apparent by comparing FIG. 2 and FIG. 3, the absolute value of the negative resistance at the C-mode overtone frequency of the case where the resonance frequency of the first resonance circuit 40 is the same as the B-mode overtone frequency is smaller than that of the case where the resonance frequency of the first resonance circuit 40 is larger than the B-mode overtone frequency. Therefore, the resonance frequency of the first resonance circuit 40 may preferably be larger than the B-mode overtone frequency so that the negative resistance at the C-mode overtone frequency is large enough.

Effect in the Oscillator Circuit 10 of the First Embodiment

As mentioned above, since the oscillator circuit 10 has a negative resistance with a negative value at the C-mode overtone frequency, and a negative resistance with a positive value at the fundamental frequency and at the B-mode overtone frequency, the oscillator circuit 10 of the first embodiment is effective for stably oscillating at the C-mode overtone frequency.

Furthermore, because the transistor 30 is used in a common emitter amplifier circuit, and because the first inductor 42, the resistor 46, and the fourth capacitor 48 are between the emitter of the transistor 30 and the ground 70, the oscillator circuit 10 can output a voltage signal large enough at the C-mode overtone frequency without having an amplifier circuit on the downstream side of the oscillator circuit 10. Accordingly, the oscillator circuit 10 is effective in allowing for downsizing of the circuit and in reducing the cost, due to the reduced number of circuit elements.

The Second Embodiment

Figure 4:
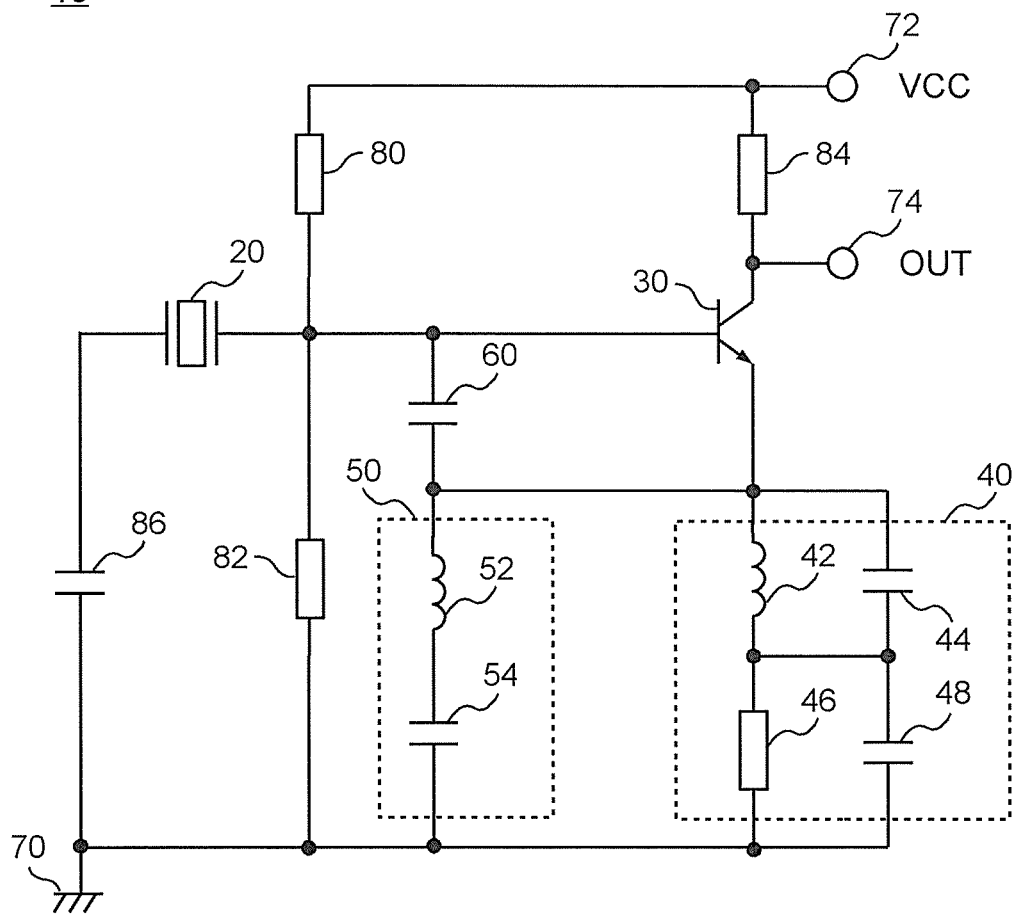
FIG. 4 shows a configuration of the oscillator circuit in the second embodiment.
Figure 5:
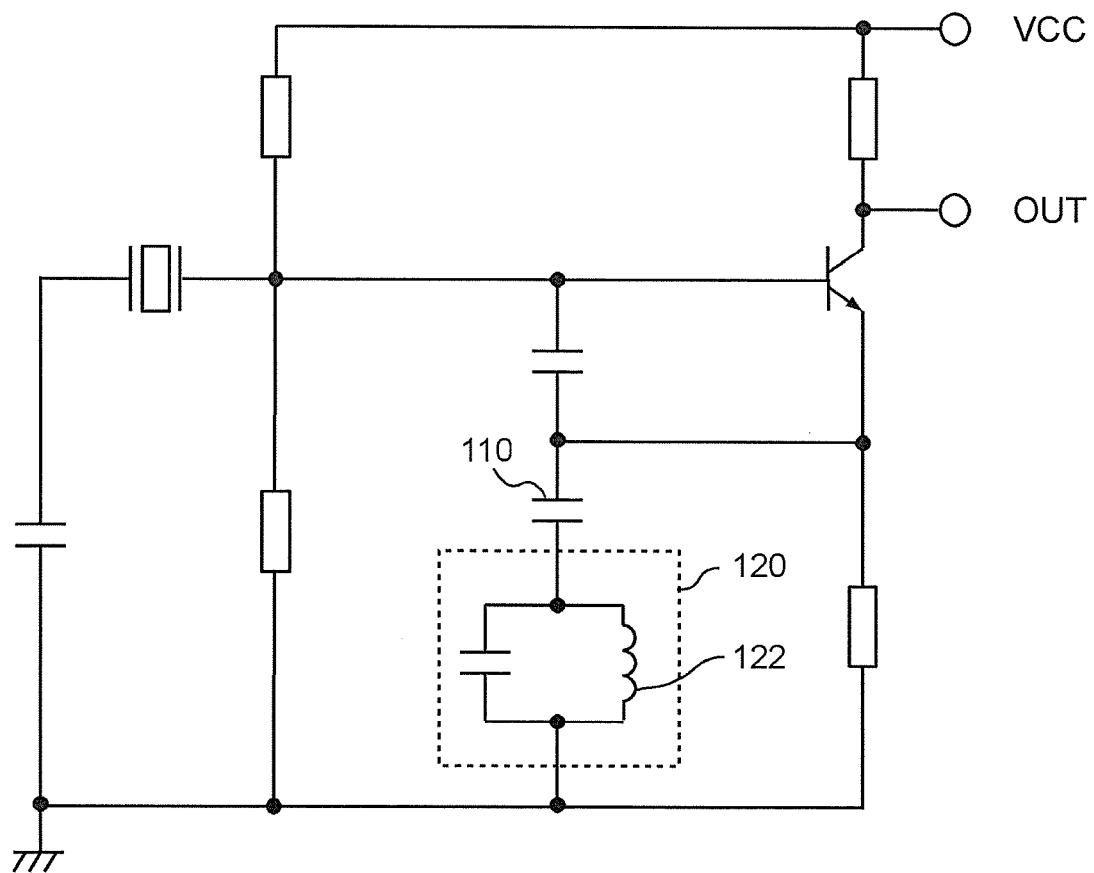
FIG. 5 shows an oscillator circuit disclosed in Japanese Unexamined Patent Application Publications No. 2004-266583.
Figure 6:
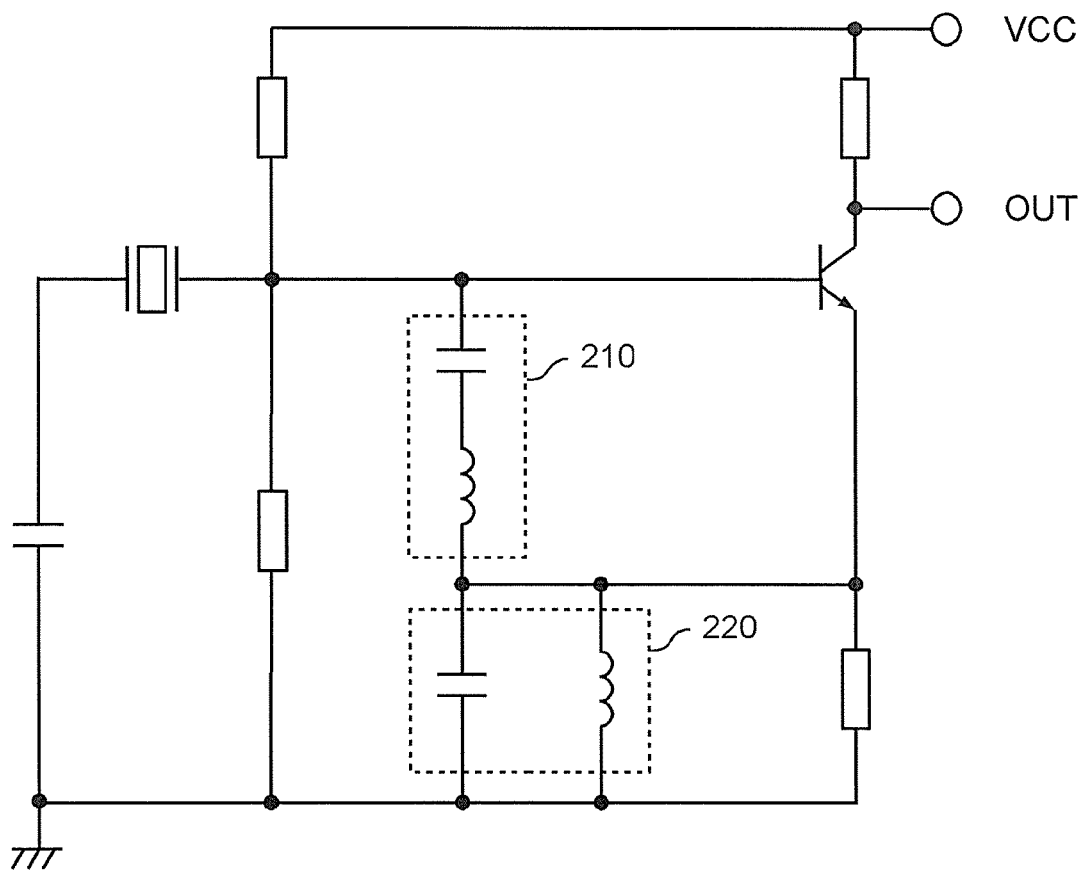
FIG. 6 shows an oscillator circuit disclosed in Japanese Unexamined Patent Application Publications No. 2004-289207.
Figure 7:
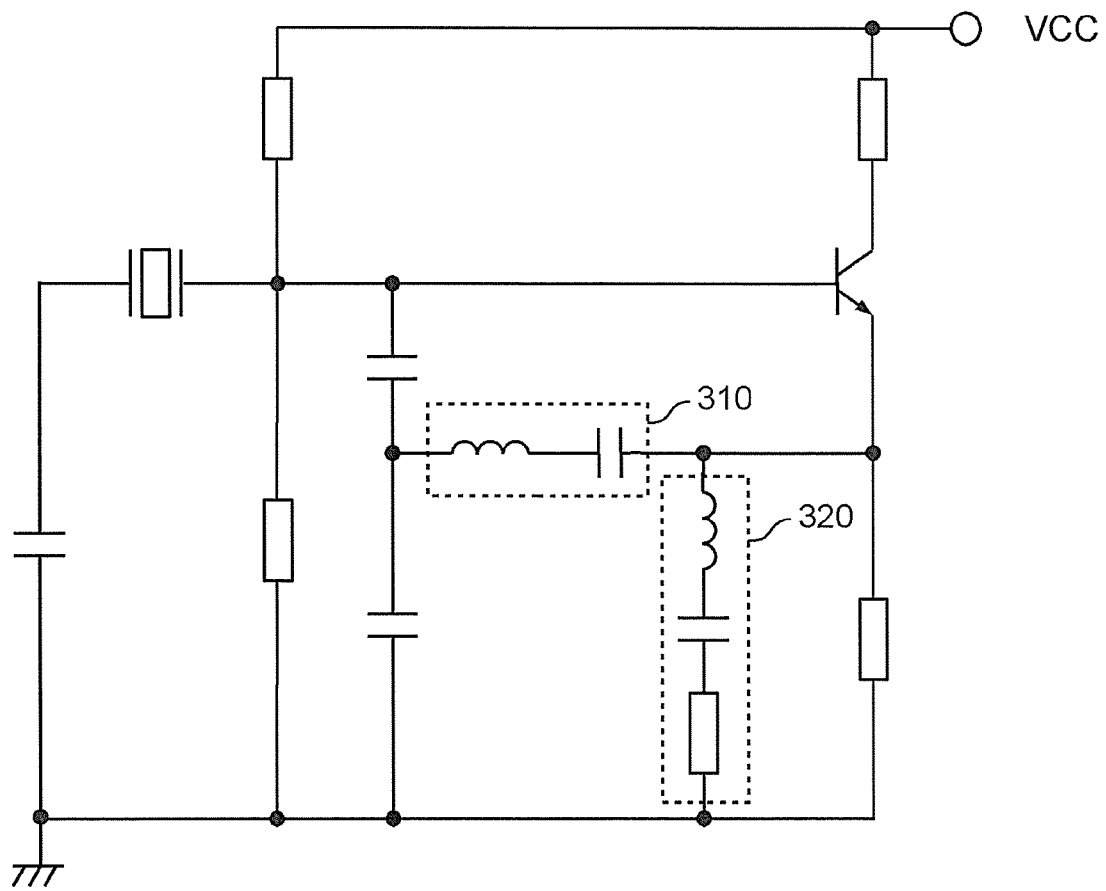
FIG. 7 shows an oscillator circuit disclosed in Japanese Unexamined Patent Application Publications No. 2006-345115.
Figure 8:
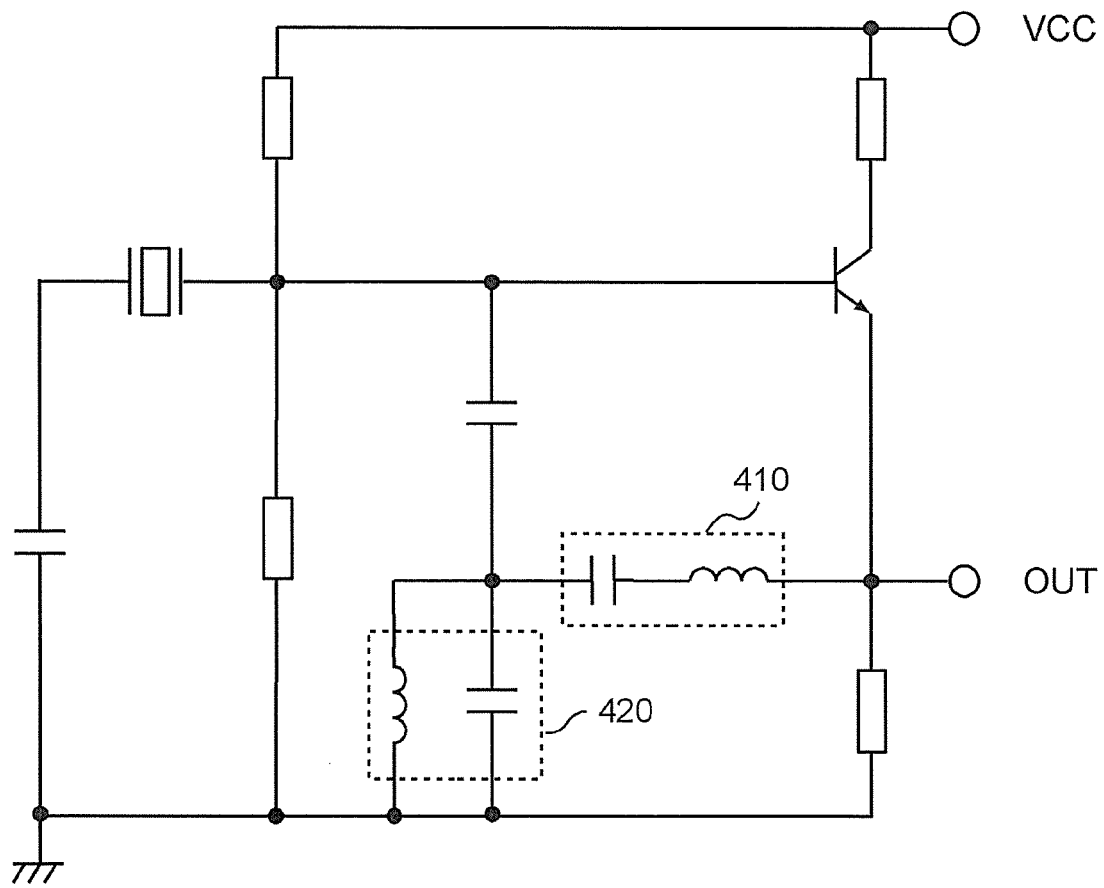
FIG. 8 shows an oscillator circuit disclosed in Japanese Unexamined Patent Application Publications No. 2007-20158.
Figure 9:
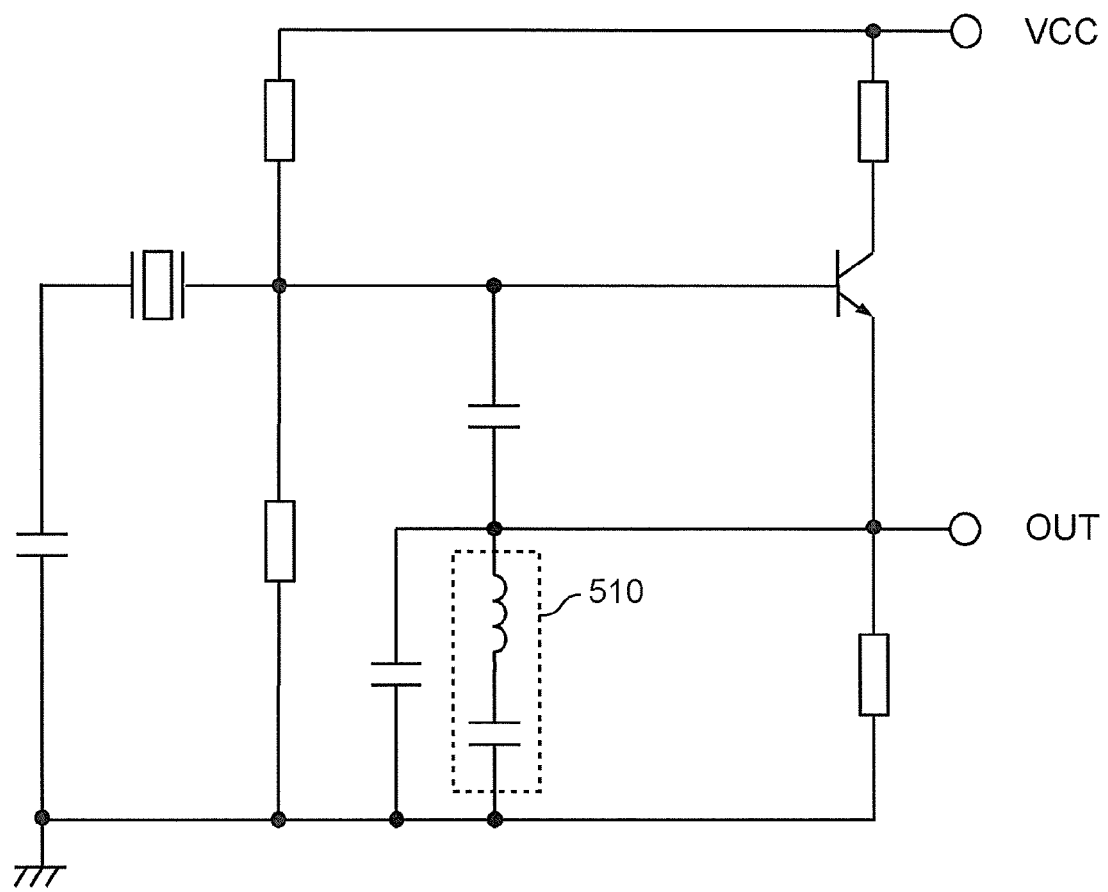
FIG. 9 shows an oscillator circuit disclosed in Japanese Unexamined Patent Application Publications No. 2010-41346.

FIG. 4 shows a configuration of the oscillator circuit 10 of the second embodiment. The oscillator circuit 10 shown in FIG. 4 is different from the oscillator circuit 10 shown in FIG. 1 in the point that the first capacitor 44 is between (i) the emitter of the transistor 30 and (ii) the connection point of the resistor 46 and the fourth capacitor 48.

That is to say, in the oscillator circuit 10 of the present embodiment, both ends of the first capacitor 44 are connected to both ends of the first inductor 42. Thus, since the first inductor 42 and the first capacitor 44 can be proximally implemented, the oscillator circuit 10 is effective in stabilizing the resonance frequency of the first resonance circuit 40.

While the present disclosure has been explained with the embodiment, the technical scope of the present disclosure is not limited to the embodiment. For example, although the above-mentioned embodiment uses an SC-cut crystal oscillator for oscillation, an IT-cut crystal oscillator, an LC resonance circuit, a ceramic oscillator, a SAW (Surface Acoustic Wave) resonator, an MEMS (Micro Electro Mechanical Systems) resonator, or a combination of these devices can be used in the present disclosure. Also, although the above-mentioned embodiment uses discrete elements, the same effect can be achieved by implementing the oscillator circuit of the present disclosure in internal integrated circuits such as an ASIC (Application Specific Integrated Circuit).

In the above-mentioned oscillator circuit, the first resonance frequency of the first resonance circuit is higher than the overtone frequency of the main oscillation of the crystal oscillator, and the second resonance frequency of the second resonance circuit is lower than the overtone frequency of main oscillation of the crystal oscillator. As a result, the above-mentioned oscillator circuit has a negative resistance with a negative value at the overtone frequency of the main oscillation of the crystal oscillator, and has the negative resistance with a positive value (i) at the fundamental frequencies of the main oscillation and the sub oscillation of the crystal oscillator and (ii) at the overtone frequency of sub oscillation of the crystal oscillator. The above-mentioned first resonance frequency is, for example, higher than the overtone frequency of the sub oscillation of the crystal oscillator. The above-mentioned second resonance frequency is, for example, the same as the fundamental frequency of the main oscillation of the crystal oscillator.

The above-mentioned oscillator circuit may further comprise a resistor and a fourth capacitor that are in parallel between the emitter and the ground through the first inductor, wherein the first capacitor is between the emitter and the ground, and the first inductor is between (i) the emitter and (ii) the resistor and the fourth capacitor. The capacitance of the fourth capacitor is larger than that of the first capacitor.

The above-mentioned oscillator circuit may further comprise an output terminal that is connected to the collector of the transistor, and a load resistor that is connected between the output terminal and the power supply. The above-mentioned first resonance circuit may be a parallel resonance circuit that contains the first inductor and the first capacitor connected in parallel, and the above-mentioned second resonance circuit may be a serial resonance circuit that contains the second inductor and the second capacitor connected in series.

The above-mentioned oscillator circuit may have a resistor and the fourth capacitor between the emitter and the ground. In this case, the first capacitor and the first inductor are in parallel between the emitter and ground, and the first inductor may be between (i) the emitter and (ii) the resistor and the fourth capacitor. The above-mentioned oscillator circuit may further have an output terminal that is at a collector of the transistor.

According to the present disclosure, an effect of providing an oscillator circuit that stably oscillates at the overtone frequency of the C-mode, which is the mode of the main oscillation, can be achieved.

What is claimed is:

1. An oscillator circuit, comprising:
   a crystal oscillator;
   a transistor, a base of the transistor is connected to the crystal oscillator;
   a first resonance circuit that is between an emitter of the transistor and a ground, the first resonance circuit having a first inductor and a first capacitor;
   a second resonance circuit that is between the emitter and the ground, the second resonance circuit having a second inductor and a second capacitor; and
   a third capacitor that is between the base and the emitter, wherein
   a first resonance frequency of the first resonance circuit is higher than a overtone frequency of a main oscillation of the crystal oscillator,
   a second resonance frequency of the second resonance circuit is lower than the overtone frequency of the main oscillation of the crystal oscillator, and
   the oscillator circuit has a negative resistance with a negative value at the overtone frequency of main oscillation of the crystal oscillator, and has the negative resistance with a positive value (i) at fundamental frequencies of the main oscillation and a sub oscillation of the crystal oscillator and (ii) at the overtone frequency of the sub oscillation of the crystal oscillator,
   the first resonance circuit is a parallel resonance circuit that contains the first inductor and the first capacitor connected in parallel between the emitter of the transistor and the ground, and
   the second resonance circuit is a serial resonance circuit that contains the second inductor and the second capacitor connected in series between the emitter of the transistor and the ground.

2. The oscillator circuit according to claim 1, wherein the first resonance frequency is higher than the overtone frequency of the sub oscillation of the crystal oscillator.

3. The oscillator circuit according to claim 1, wherein the second resonance frequency is the same as the fundamental frequency of the main oscillation of the crystal oscillator.

4. The oscillator circuit according to claim 1, further comprising:
   a resistor and a fourth capacitor that are in parallel between the emitter and the ground through the first inductor, wherein
   the first capacitor is between the emitter and the ground, and the first inductor is between (i) the emitter and (ii) the resistor and the fourth capacitor.

5. The oscillator circuit according to claim 4, wherein a capacitance of the fourth capacitor is larger than a capacitance of the first capacitor.

6. The oscillator circuit according to claim 4, further comprising:
  an output terminal that is connected to a collector of the transistor; and
  a load resistor that is connected between the output terminal and a power supply.

7. The oscillator circuit according to claim 1, further comprising:
  a resistor and a fourth capacitor in parallel between the emitter and the ground, wherein
  the first capacitor and the first inductor are in parallel between the emitter and ground, and
  the first inductor is between (i) the emitter and (ii) the resistor and the fourth capacitor.

* * * * *